United States Patent
Souriau et al.

(10) Patent No.: US 7,026,239 B2
(45) Date of Patent: Apr. 11, 2006

(54) METHOD FOR MAKING AN ANISOTROPIC CONDUCTIVE POLYMER FILM ON A SEMICONDUCTOR WAFER

(75) Inventors: Jean-Charles Souriau, Saint Egreve (FR); Pierre Renard, Grenoble (FR); Jean Brun, Champagnier (FR)

(73) Assignee: Commissariat a l'Energie Atomique, Paris (FR)

(*) Notice: Subject to any disclaimer, the term of this patent is extended or adjusted under 35 U.S.C. 154(b) by 0 days.

(21) Appl. No.: 10/488,939

(22) PCT Filed: Jul. 22, 2003

(86) PCT No.: PCT/FR03/02312

§ 371 (c)(1), (2), (4) Date: Mar. 16, 2004

(87) PCT Pub. No.: WO2004/012226

PCT Pub. Date: Feb. 5, 2004

(65) Prior Publication Data

US 2004/0241932 A1    Dec. 2, 2004

(30) Foreign Application Priority Data

Jul. 24, 2002 (FR) .................. 02 09378

(51) Int. Cl.
*H01L 21/4763* (2006.01)

(52) U.S. Cl. .............. 438/637; 438/672; 438/673; 438/638

(58) Field of Classification Search ........ 438/637–638, 438/672–673, 612–617; 257/737–740
See application file for complete search history.

(56) References Cited

U.S. PATENT DOCUMENTS

| 5,543,585 A | 8/1996 | Booth et al. |
| 5,879,530 A | 3/1999 | Caillat |
| 6,803,303 B1 * | 10/2004 | Hiatt et al. .............. 438/612 |
| 2001/0013661 A1 | 8/2001 | Yamaguchi et al. |

FOREIGN PATENT DOCUMENTS

WO    99/05717    2/1999

OTHER PUBLICATIONS

Jean-Charles Souriau, et al., "Electrical Conductive Film for Flip-Chip Interconnection Based on Z-axis Conductors", Electronic Components and Technology Conference, pp. 1151-1153 2002.

* cited by examiner

*Primary Examiner*—Dung A. Le
(74) *Attorney, Agent, or Firm*—Oblon, Spivak, McClelland, Maier & Neustadt, P.C.

(57) ABSTRACT

A method of manufacturing an anisotropic conductive polymer film on a semiconductor wafer including on one surface a layer of passivation in which at least one opening is made to allow access to a contact pad. The method can be applied to creating components (chips, integrated circuits) with high-density interconnections.

6 Claims, 7 Drawing Sheets

FIG. 1A

BACKGROUND ART

FIG. 1B

BACKGROUND ART

METHOD FOR MAKING AN ANISOTROPIC CONDUCTIVE POLYMER FILM ON A SEMICONDUCTOR WAFER

TECHNICAL FIELD AND PRIOR ART

The invention relates to a method of manufacturing anisotropic conductive polymer film on a semiconductor wafer. The invention also relates to a method of manufacturing semiconductor chips equipped with an anisotropic conductive polymer film as well as a semiconductor chip equipped with an anisotropic conductive polymer film.

With the expansion of multimedia, numerous electronic devices should be capable of quickly and simply managing, processing and transmitting large quantities of information. These devices require an increase in the density of interconnections as well as a reduction in their weight and manufacturing cost.

There are several large families of techniques for connecting chips and integrated circuits to interconnection substrates such as, for example, the flip chip technique and the ACF (Anisotropic Conductive Film) technique. These techniques have a certain number of advantages for integrated circuits. Given the surface allocation of the contact pads, they provide the capacity of connecting chips with a high density of interconnections in a limited volume whilst maintaining or improving the electronic performance, notably in reducing the effects of self-inductance. These techniques are used, for example, in mobile phones and, more generally, in multimedia devices, as was mentioned above.

Among the flip chip type techniques, the technique using fusible microbeads is currently the most widely used. This technique is based on the implementing of a method on a full wafer of semiconductive material requiring two levels of lithography: a first level to define the metallurgical adherence of the microbeads and a second level dedicated to the electrolytic depositing of fusible materials. This method is not used for the interconnecting of cut chips or when the number of wafers to be processed is too small to justify the designing of specific masks needed in the lithographic stage.

The ACF technique relates to conductive films made of conductive particles incorporated into an insulator film or of metal inserts included in the insulator film.

Figure 1A:
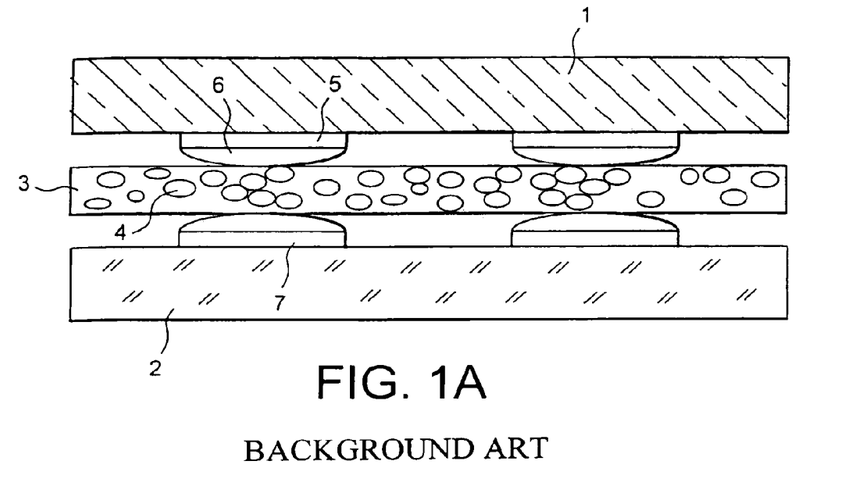
FIGS. 1A and 1B represent the interconnection of a chip and of a substrate according to the known art, using, respectively, an anisotropic conductive polymer film with conductive particles and an anisotropic conductive polymer film with conductive inserts.

The ACF films with conductive particles incorporated into an insulator film are the most widespread. This type of film is based on hazardous allocation of conductive particles in a polymer matrix. The conductive particles typically have a diameter of a few microns. They are either polymer beads covered in metal or metal beads that can be, for example, in nickel or silver. Interconnection is achieved by gluing the film between the substrate and the chip, the gluing being followed by thermocompression. The interconnection of a chip and a substrate using a film of conductive particles is represented in FIG. 1A. A chip 1 equipped with conductive pads 5 is connected to a substrate 2 equipped with conductive pads 7. An ACF film composed of an insulator film 3 into which are incorporated conductive particles 4 is placed between the chip and the substrate. Projections 6 create the contact between the conductive pads and the ACF film. This type of interconnection leads to a relatively high electric contact resistance, which reduces the scope of its fields of application. A known application is, for example, the field of flat screens.

Figure 1B:
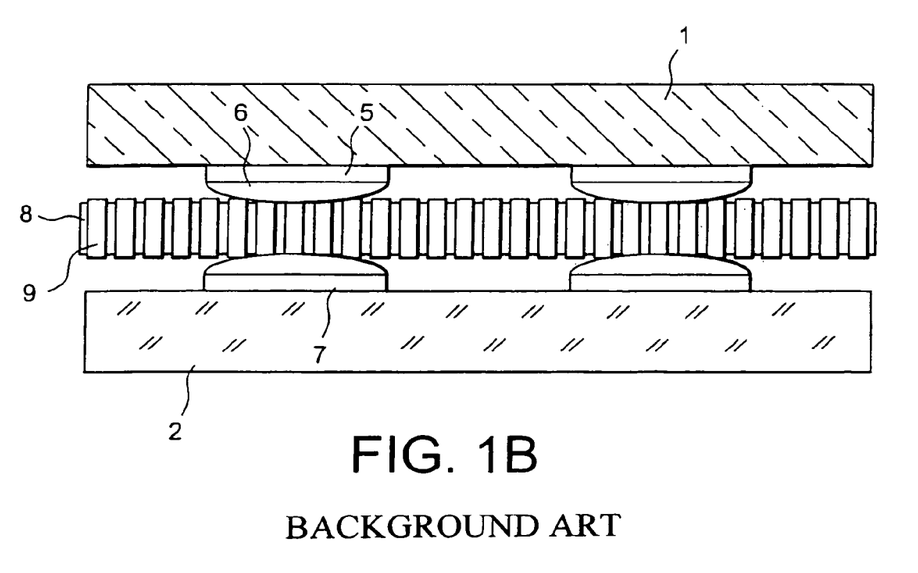

The aforementioned inconvenience led to the designing of ACF films with metal insertion mount components. The manufacturing of an ACF film with metal insertion mount components is based on the orderly insertion of metal microstructures into a pool of polymer. The interconnection of a chip and a substrate using a film with metal insertion mount components is represented in FIG. 1B. The ACF film is composed of an insulator film 8 into which are placed metal inserts 9. A high redundancy of the number of contacts per pad ensures an even contact with low resistivity which allows the flow of high currents.

The use of ACF films, however, leads to several problems among which is the reliability of electric contact. Indeed, it creates oxidized scales on the ends of the metal inserts and on the interconnection pads of the chip, which leads to a major reduction in the quality of the electric contacts. A solution was proposed for this problem, that being, the adding of a fusible material at the ends of the metal inserts. However, the fusible material is susceptible to creep during its refusion and, hence, short circuit the metal inserts. Additionally, impurities can be brought in between the film and the chip or between the film and its substrate during hybridisation.

Another problem is linked to the handling of thin ACF films. The films are made on a rigid sacrificial base which must be separated from the ACF film prior to hybridisation. Three elements must therefore be assembled, the chip, the film and the substrate.

The invention does not have the aforementioned inconveniences.

PRESENTATION OF THE INVENTION

Indeed, the invention relates to a method of manufacturing anisotropic conductive polymer film on a semiconductor wafer covered, on one surface, with a layer of passivation in which at least one opening is made to allow access to an electric contact pad. The method comprises at least the following successive stages:

- depositing of a conductive layer on the layer of passivation and on the contact pad;
- depositing of a layer of photosensitive polymer on the conductive layer;
- insulating and developing of the layer of photosensitive polymer through a mask so as to create insertion holes;
- filling of the insertion holes with one or more conductive materials so as to create a conductive insert in each hole;
- removing of the layer of photosensitive polymer;
- etching of the conductive layer in the zones located between the inserts;
- depositing of a layer of insulating material between the conductive inserts.

According to an advantageous embodiment, the filling of the insertion holes is performed via electrolytic growth assisted with or without an electric field.

According to an alternative, the method according to the invention comprises, between the stage of the filling of the insertion holes with one or more conductive materials and the stage of removing the layer of polymer, the following successive stages:

- depositing of a photosensitive resin on the layer of photosensitive polymer in which the conductive inserts are created;
- insulating and developing of the photosensitive resin through a mask so that only a pellet of resin lies on the tip of a first end of each insert;
- isotropic chemical etching of the first ends of the conductive inserts down to the removal of the resin pellets so that a point appears on the first end of each conductive insert.

The invention also relates to a method of manufacturing semiconductor chips. The method comprises a method of manufacturing anisotropic conductive polymer film on a semiconductor wafer according to the invention and a stage of cutting a base derived from said method of manufacturing anisotropic conductive polymer film on a semiconductor wafer.

The invention further relates to a semiconductor chip comprising, on one surface, a layer of passivation in which at least one opening is made to allow access to a contact pad. The chip comprises, on the layer of passivation and the contact pad, an anisotropic conductive polymer film composed of conductive inserts held tightly in an insulating material, a conductive insert having a first end projecting beyond the insulating material and a second end in contact with the layer of passivation or with the contact pad through a conductive element.

The anisotropic conductive film according to the invention is made directly on a wafer of semiconductive material in which there are active and/or passive elements of integrated circuit type. The method according to the invention makes it possible to ensure an excellent electric connection between the metals put into contact. The metal inserts are connected to the interconnection pads in a practically irreversible manner thanks to a non-fusible adhesion material.

The anisotropic conductive polymer film allows chip-substrate contacts to be made bearing low electric resistance, good mechanical solidity and good reliability.

BRIEF DESCRIPTION OF THE FIGURES

Other characteristics and advantages of the invention will become clearer upon reading a preferred embodiment of the invention made in reference to the attached figures among which.

On all the figures, identical numbers represent the same elements.

DETAILED DESCRIPTION OF THE MODES OF EMBODIMENT OF THE INVENTION

Figure 2:
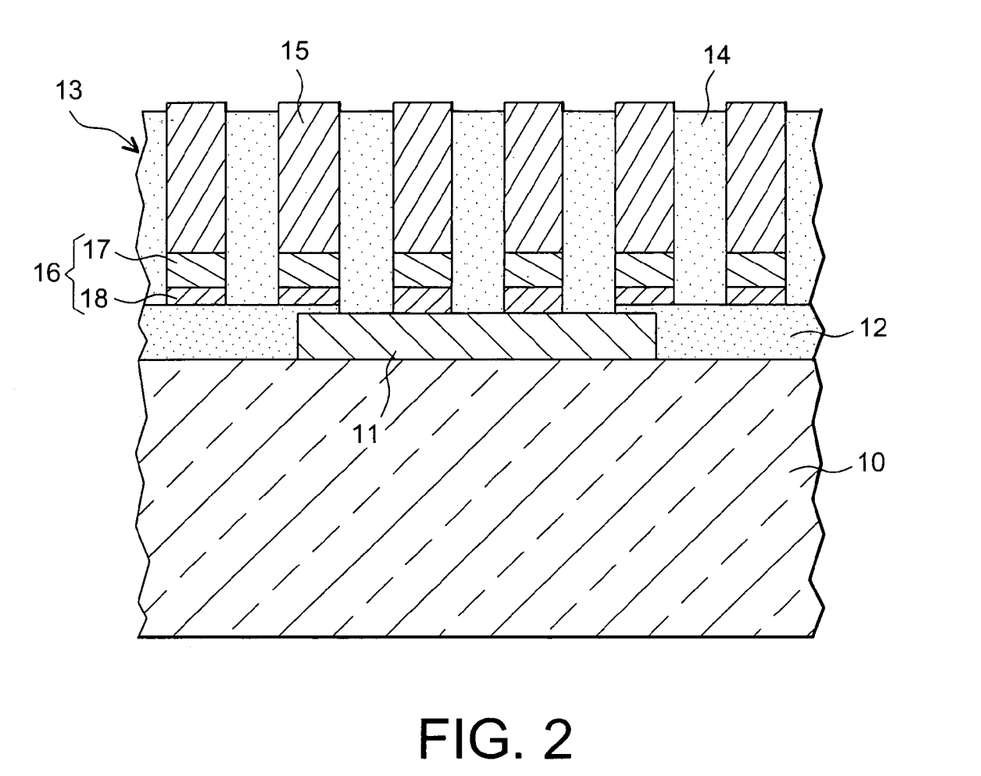
FIG. 2 represents a chip equipped with an anisotropic conductive polymer film according to the invention.

FIG. 2 represents an example of a semiconductor chip equipped with an anisotropic conductive polymer film according to the invention.

A chip 10 is equipped with an interconnection pad 11 placed in an opening of a layer of passivation 12. A conductive film 13 comprising a layer of insulating material 14 in which conductive inserts 15 are placed covers the layer of passivation 12 and the contact pad 11. A metal insert 15 has a first end which projects beyond the insulating film 14 and a second end connected via a conductive element 16 to the layer of passivation 12 or to the conductive pad 11. The conductive element 16 is composed of a metal pellet 17 and an adhesion element 18.

The method of manufacturing conductive polymer film on a semiconductor wafer according to the invention will now be described with reference to FIGS. 3A–3I.

The method is implemented using a wafer of semiconductive material. The semiconductor wafer T is covered, on one surface, with a layer of passivation 12 in which openings are made to allow access to contact pads 11 (see FIG. 3A). The first stage of the method is the depositing in a full layer of a conductive and adhesive material 19 on the layer of passivation 12 and the contact pads 11 (see FIG. 3B). The conductive and adhesive material 19 is, for example, made of Ti, Cr, W, Ta, etc. This stage is preferably carried out after stripping the surface of the pads. The depositing of at least one metal layer 20 (Cu, Ni, Ti, Au, Al, etc.) is then applied to the layer 19 (see FIG. 3C). The metal layer 20 is intended to act as an electric current supplying layer during the electrolytic growth of the conductive inserts. We then deposit a resin type layer of photosensitive polymer 21 on the metal layer 20 (see FIG. 3D). The thickness of the layer of photosensitive polymer 21 lies between a few $\mu m$ and several tens of $\mu m$. The layer 21 is then insulated through a mask so as to create insertion holes 22 (see FIG. 3E). Typically the holes can have a depth of a few $\mu m$ to several tens of $\mu m$ depending on the thickness of the layer 21. The mask allowing the formation of the holes ensures an even allocation and redundance of the latter. The holes are then filled with one or more conductive materials (Cu, Ni, Ti, Cr, W, SnPb, Au, Ag, etc.), for example via electrolysis, to create the conductive inserts 23 (see FIG. 3F). The resin is then removed for example via dissolving (see FIG. 3G). The layer of conductive and adhesive material 19 and the metal layer 20 constitute a conductive layer which is then selectively etched in the zones located between the inserts (see FIG. 3H). The etched layers 19 and 20 then form the conductive elements 16, each element 16 comprising a metal pellet 17 derived from the metal layer 20 and an adhesion element 18 derived from the layer 19. The contact pads 11 are then electrically insulated from each other. This stage can be carried out via dry or chemical means, the latter being of preference. An insulating material 24 is deposited on the plate, partially covering the metal inserts (see FIG. 3I). In the case where the insulating material entirely covers the inserts, we perform an etching to expose them. This material is preferably a polymer such as a polyimide, a thermoplastic material, a photosensitive resin or any type of glue. It is also possible to spread a fusible glass commonly known as Spin on Glass.

To obtain a semiconductor chip according to the invention, it suffices to cut the semiconductor wafer covered in anisotropic conductive polymer film into as many elementary chips as is necessary.

An alternative to the method of manufacturing conductive polymer film according to the invention will now be described with reference to FIGS. 4A–4F. According to this alternative, the conductive inserts have a pointed end allowing an improved electric contact of the anisotropic conductive polymer film and of the substrates onto which we wish to transfer the chips.

Figure 3A:
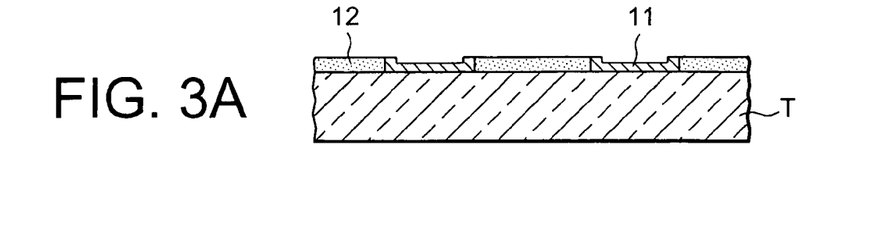
FIGS. 3A–3I represent a method of manufacturing anisotropic conductive polymer film on a semiconductor wafer according to the invention.
Figure 3B:
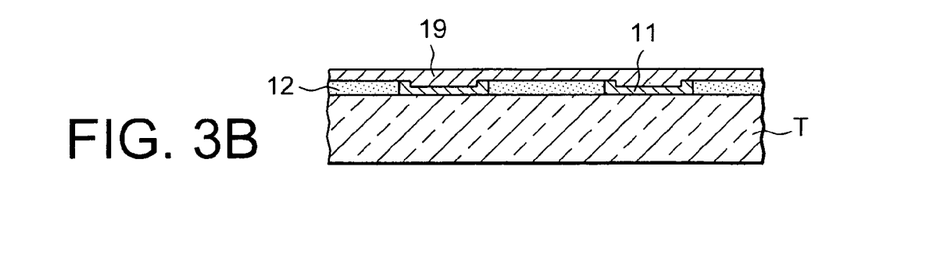
Figure 3C:
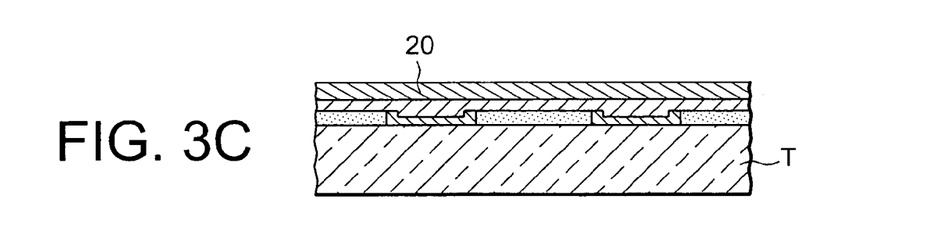
Figure 3D:
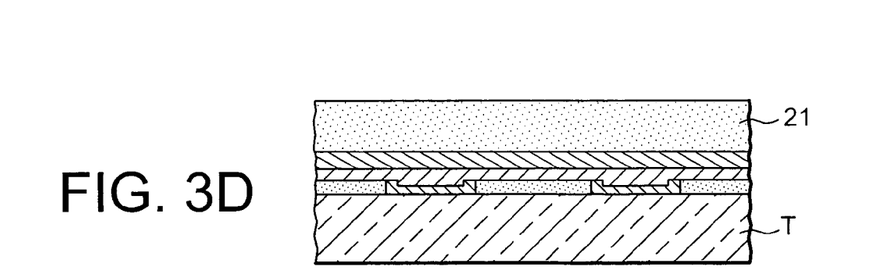
Figure 3E:
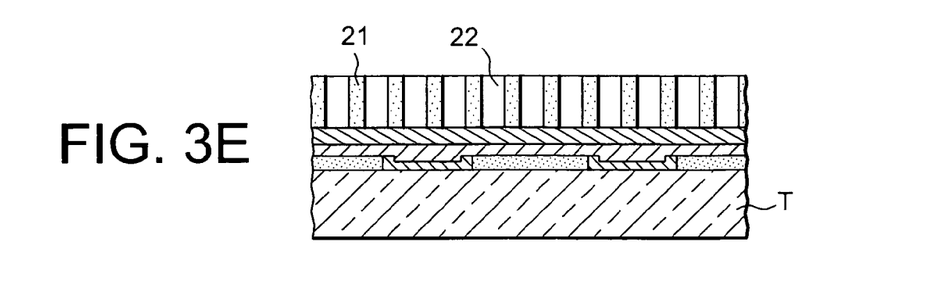
Figure 3F:
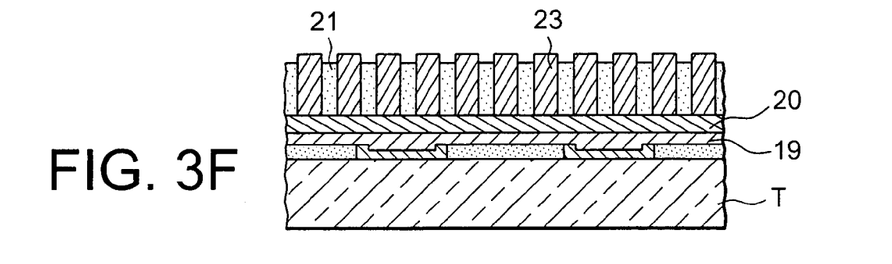
Figure 3G:
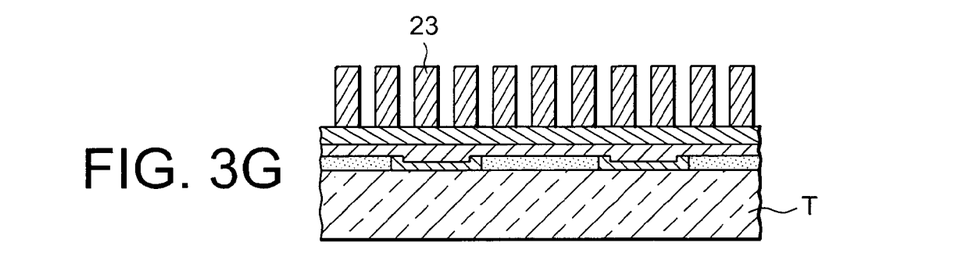
Figure 3H:
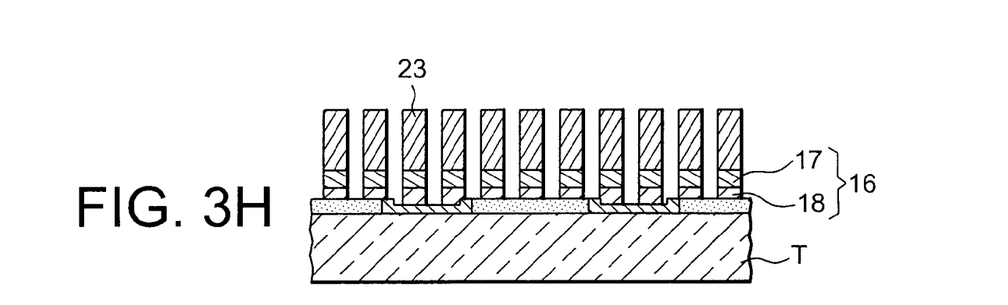
Figure 3I:
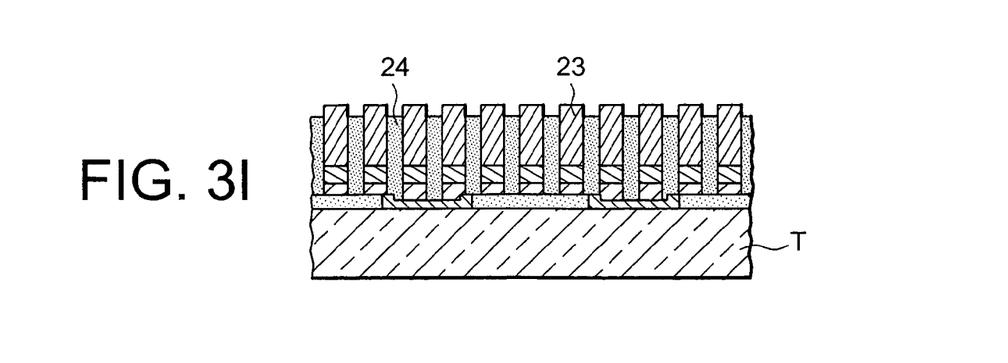

The method according to the alternative of the invention comprises additional stages between the stage of creating the conductive inserts (see FIG. 3F) and the stage of removing the layer of photosensitive polymer (see FIG. 3G). According to the alternative of the invention, the stage of creating the conductive inserts, is here followed by the depositing of a photosensitive resin 25 over all of the inserts (see FIG. 4A). The photosensitive resin is insulated through a mask so that only a resin pellet 26 lies on the tip of each insert (see FIG. 4B). An isotropic etching, for example via wet or dry means (for example diluted nitric acid for nickel inserts), of the inserts is then carried out (see FIG. 4C) until the resin pellets are removed (see FIG. 4D). A point 27 then appears at the end of each insert.

Figure 4A:
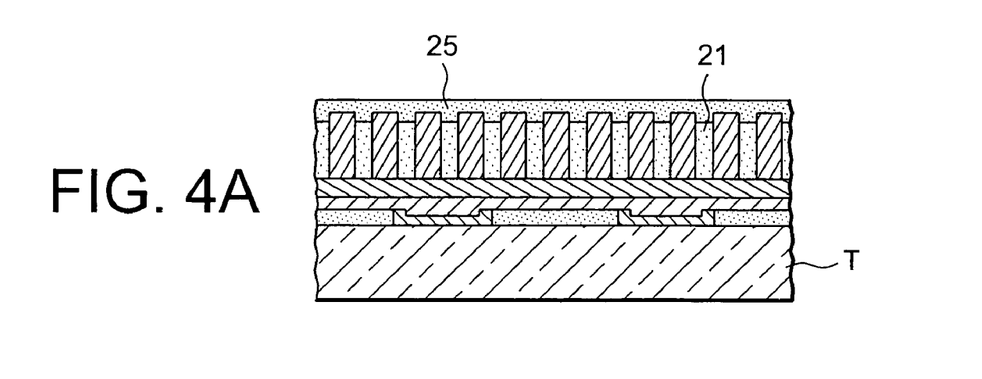
FIGS. 4A–4F represent an alternative to the method of manufacturing represented in FIGS. 3A–3I.
Figure 4B:
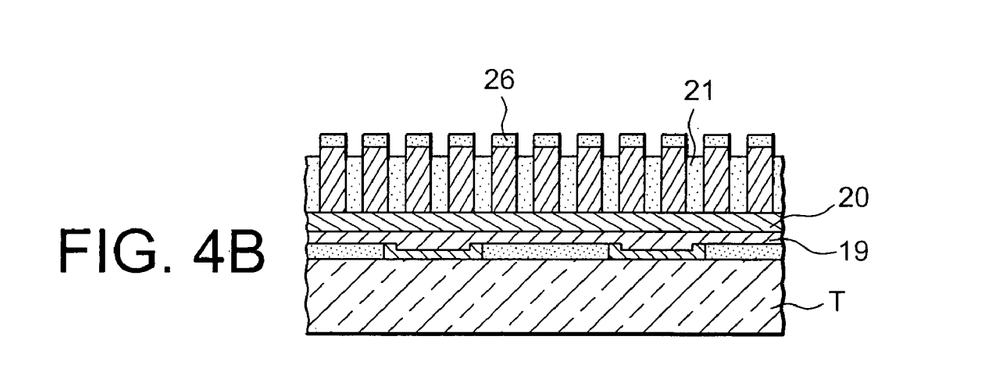
Figure 4C:
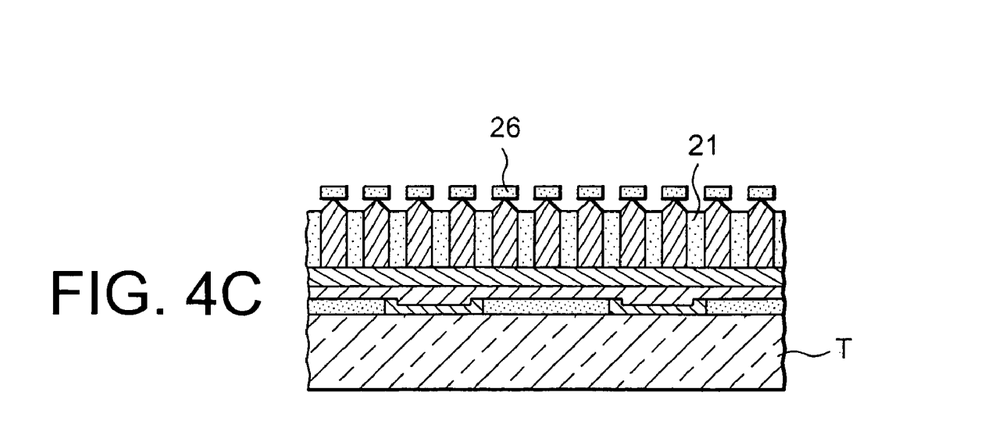
Figure 4D:
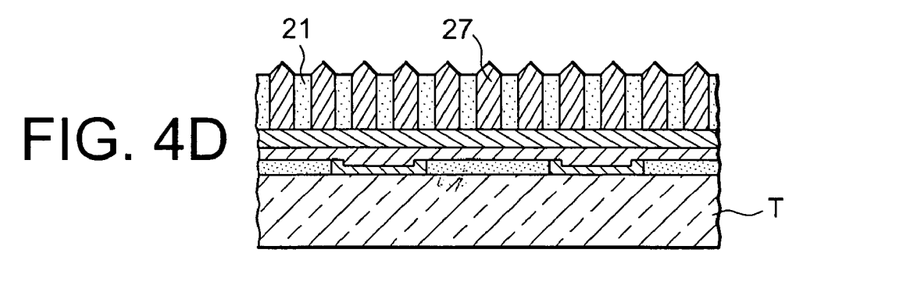
Figure 4E:
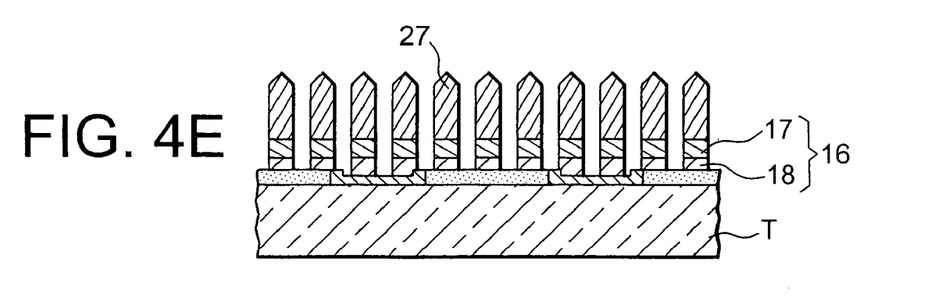
Figure 4F:
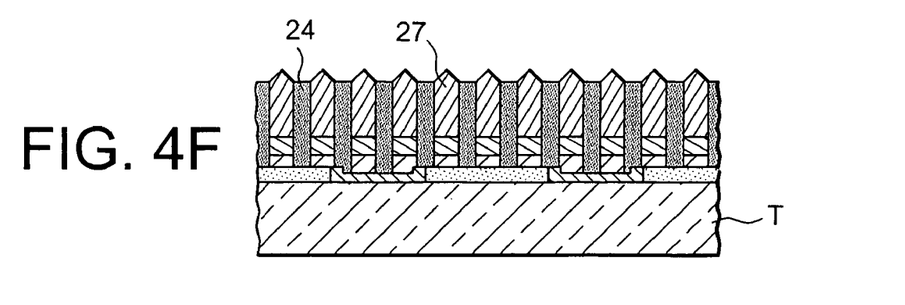

The method then proceeds as per the aforementioned stages, that being, the removing of the layer of photosensitive polymer and the selective etching of the metal layers deposited in full layers (see FIG. 4E). The depositing of an insulating material 24, covering the inserts with the exception of the points 27 (see FIG. 4F), follows the selective etching of the metal layers.

The presence of an anisotropic conductive polymer film directly applied onto a chip, as described above, considerably simplifies the hybridisation process of the chip on a substrate. Indeed, it is no longer necessary to handle a film to place it between the chip and the substrate. Only two elements need to be handled, the chip and the substrate. Moreover, thanks to the adhesion layer under the inserts, the electric contact of the anisotropic conductive polymer film on the chip is of very good quality.

Other advantages of the method according to the invention can be highlighted. Thus, the manufacturing of an anisotropic conductive polymer film according to the method of the invention does not require the critical aligning stage as the redundance of the holes performed during the etching stage (see FIG. 3E) leads to such a redundance of the conductive inserts that there are inevitably inserts above the pads to be connected. Another advantage consists in that the manufacturing of an anisotropic conductive polymer film according to the method of the invention allows the use of any type of polymer, even fusible glass.

The invention claimed is:

1. A method of manufacturing an anisotropic conductive polymer film on a semiconductor wafer including, on one surface, a layer of passivation in which at least one opening is made to allow access to a contact pad, the method comprising:
   depositing a conductive layer on the layer of passivation and on the contact pad of the semiconductor wafer;
   depositing a layer of photosensitive polymer on the conductive layer;
   insulating and developing the layer of photosensitive polymer through a mask to create insertion holes;
   filling the insertion holes with one or more conductive materials to create a conductive insert in each insertion hole;
   removing the layer of photosensitive polymer;
   etching the conductive layer in zones located between the conductive inserts; and
   depositing a layer of insulating material between the conductive inserts.

2. A method set forth in claim 1, wherein the conductive layer has a layer of conductive and adhesive material deposited on the layer of passivation and on the contact pad and at least one metal layer deposited on the layer of conductive and adhesive material.

3. A method set forth in claim 1, further comprising, between the filling of the insertion holes and the removing the layer of polymer:
   depositing a photosensitive resin on the layer of photosensitive polymer in which the conductive inserts are created;
   insulating and developing the photosensitive resin through a mask so that only a pellet of resin lies on a tip of a first end of each insert;
   isotropic chemical etching the first ends of the inserts until removal of the resin pellets so that a point appears on the first end of each insert.

4. A method set forth in claim 1, wherein the filling of the insertion holes is performed by electrolytic growth.

5. A method set forth in claim 1, wherein the etching of the conductive layer is wet etching or dry etching.

6. A method of manufacturing semiconductor chips, comprising a method of manufacturing anisotropic conductive polymer film on a semiconductor wafer set forth in claim 1, and further comprising cutting a base obtained by the method of manufacturing anisotropic conductive polymer film.

* * * * *